(12) United States Patent
DeBrosse

(10) Patent No.: US 8,331,125 B2
(45) Date of Patent: Dec. 11, 2012

(54) ARRAY ARCHITECTURE AND OPERATION FOR HIGH DENSITY MAGNETIC RACETRACK MEMORY SYSTEM

(75) Inventor: John K. DeBrosse, Essex Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 307 days.

(21) Appl. No.: 12/548,113

(22) Filed: Aug. 26, 2009

(65) Prior Publication Data

US 2011/0051490 A1    Mar. 3, 2011

(51) Int. Cl.
*G11C 19/00* (2006.01)

(52) U.S. Cl. ............................................. 365/80; 365/81
(58) Field of Classification Search .................... 365/80, 365/75, 74, 73, 81, 87
See application file for complete search history.

(56) References Cited

U.S. PATENT DOCUMENTS

| | | | |
|---|---|---|---|
| 6,834,005 B1 | 12/2004 | Parkin | |
| 6,898,132 B2 | 5/2005 | Parkin | |
| 6,920,062 B2 | 7/2005 | Parkin | |
| 7,031,178 B2 | 4/2006 | Parkin | |
| 7,236,386 B2 | 6/2007 | Parkin | |
| 7,514,271 B2 | 4/2009 | Gaidis et al. | |
| 7,551,469 B1 | 6/2009 | Parkin | |
| 2007/0087454 A1 | 4/2007 | Chen et al. | |
| 2008/0080234 A1 | 4/2008 | Iwata et al. | |
| 2009/0021866 A1 | 1/2009 | Togoawa et al. | |
| 2009/0146208 A1 | 6/2009 | Ban et al. | |
| 2009/0290410 A1* | 11/2009 | Wang et al. | 365/158 |
| 2010/0008135 A1* | 1/2010 | Cho et al. | 365/171 |
| 2010/0080034 A1* | 4/2010 | Hung | 365/80 |

FOREIGN PATENT DOCUMENTS

| | | |
|---|---|---|
| WO | WO2007132174 A1 | 11/2007 |
| WO | WO2008139131 A1 | 11/2008 |

OTHER PUBLICATIONS

International Search Report dated Oct. 1, 2010.

* cited by examiner

*Primary Examiner* — VanThu Nguyen
*Assistant Examiner* — Khamdan Alrobaie
(74) *Attorney, Agent, or Firm* — Scully, Scott, Murphy & Presser, P.C.; Vazken Alexanian

(57) ABSTRACT

A high density memory architecture comprising magnetic racetrack memory and a method of operation. The memory architecture comprises a plurality of magnetic memory structures, each the structure formed of magnetic material; a sensing device associated with each magnetic memory structure; first decoder device initiating a track select signal for activating a single magnetic memory structure from among the plurality to perform a bit read or bit storage operation; a bit drive device for applying a first signal to form a new magnetic memory domain associated with a bit value to be stored in the activated magnetic memory structure at a first position thereof during a bit storage operation; and, a second decoder applying a second signal for advancing each the formed magnetic memory domain toward a second position of the activated memory structure. The sensing device reads a memory bit value stored at a magnetic domain at the second position of the activated memory structure. Subsequent thereto, a new magnetic memory domain associated with a bit value just read is formed such that the magnetic memory structure is returned to its original state at an end of the bit read operation.

20 Claims, 4 Drawing Sheets

ARRAY ARCHITECTURE AND OPERATION FOR HIGH DENSITY MAGNETIC RACETRACK MEMORY SYSTEM

BACKGROUND

Magnetic Racetrack Memory is a non-volatile memory technology in which data is stored as magnetic domains along a thin strip or pillar of magnetic material, e.g., ferromagnetic material. This strip or pillar is referred to as the racetrack or track and typically is of dimensions on the order of approximately h=20 nm, l=3 µm, w=90 nm (e.g., in a 90 nm technology). Each domain is created by a magnetic field resulting from current in a wire in close proximity to a portion of the track. Current passing along the length of the track causes the domains to move along the length of the track by the mechanism of spin momentum transfer. The state of a particular domain is determined by moving the domain to a position along the track where its magnetic polarity may be sensed by a Magnetic Tunnel Junction (MTJ) in close proximity to that position. The resistance of an MTJ changes based upon applied magnetic field. For this reason, an MTJ can be used as a magnetic field sensor.

Currently, there exists no memory technology that incorporates such Magnetic Racetrack Memory in a form providing a high density memory.

It would be highly desirable to provide a high density memory technology including an array of Magnetic Racetracks and a method to operate that array so as to provide a high density memory technology.

SUMMARY

A high density memory system including an array of non-volatile Magnetic Racetrack Memory structures and a method of operating the high density memory, is provided.

In one embodiment, the high density memory system comprises: a plurality of magnetic memory structures, each the structure formed of magnetic material; a sensing device associated with each magnetic memory structure; a first decoder device initiating a track select signal for activating a single magnetic memory structure from among the plurality to perform a bit read or bit storage operation; a bit drive device for applying a first signal to form a new magnetic memory domain associated with a bit value to be stored in the activated magnetic memory structure at a first position thereof during a bit storage operation; and, a second decoder applying a second signal for advancing each the formed magnetic memory domain toward a second position of the activated memory structure, wherein the sensing device reads a memory bit value stored at a magnetic domain at the second position of the activated memory structure.

According to a further embodiment of the present invention, there is provided a method of operating a high density memory array including a plurality of magnetic memory structures, the method comprising: initiating a track select signal for activating a single magnetic memory structure from among the plurality of magnetic memory structures; and, performing a bit storage operation at the activated structure comprising: a) applying a first signal to the activated magnetic memory structure for forming a magnetic racetrack memory domain at a first position thereof, the first signal of a polarity corresponding to a memory bit value for storage at the magnetic racetrack memory domain; b) asserting a second signal for advancing the formed magnetic racetrack domain having a stored bit value a distance toward a read position along a length of the track; and repeating steps a) and b) for storing multiple data bits in the magnetic memory structure.

In a further embodiment, there is provided a method of operating a high density memory array including a plurality of magnetic memory structures, the method comprising: initiating a track select signal for activating a single magnetic memory structure from among the plurality of magnetic memory structures; a) implementing a sensing device to read a memory bit value stored at a magnetic domain at the second position of the activated memory structure; b) subsequent to the reading the memory bit value, applying a first signal to form a new magnetic memory domain at a first position of the activated memory structure, the first signal of a polarity associated with a bit value of the stored memory bit that was recently read; and, c) applying a second signal for advancing the formed new magnetic memory domain toward the second position of the activated memory structure, whereby the magnetic memory structure is returned to its original state at an end of the bit read operation.

Further to this embodiment, the method further comprises repeating bit read operation steps a), b) and c) for reading multiple data bits stored in the magnetic memory structure.

In a further embodiment, there is provided a memory cell structure for a high density memory system comprising: a plurality of selectable magnetic memory structures, each the structure formed of magnetic material; a sensing device associated with each magnetic memory structure for generating a sense signal representative of a bit value stored in a magnetic memory domain provided in a magnetic memory structure; a conductive structure in proximity to the magnetic memory structure in which a first signal is provided for forming a magnetic racetrack memory domain at a first position of the magnetic memory structure, the first signal of a polarity corresponding to a memory bit value for storage at the magnetic racetrack memory domain; a first transistor device associated with a selectable magnetic memory structure, the first transistor device having a gate terminal for receiving a select signal for selecting the magnetic memory structure, and when selected, the first transistor couples a push signal to the magnetic memory structure to advance the magnetic memory domain along the memory structure toward a second position where a bit value is read; and, a second transistor device associated with the selectable magnetic memory structure, the second transistor device having a gate terminal for receiving the select signal, and, when selected, the second transistor reading a magnetic racetrack memory domain bit value at the second position and couples the sense signal from the sensing device to a sense amplifier to provide a bit value output during a bit read operation.

BRIEF DESCRIPTION OF THE DRAWINGS

The objects, features and advantages of the present invention will become apparent to one ordinary skill in the art, in view of the following detailed description taken in combination with the attached drawings, in which.

DETAILED DESCRIPTION OF THE INVENTION

Figure 1:
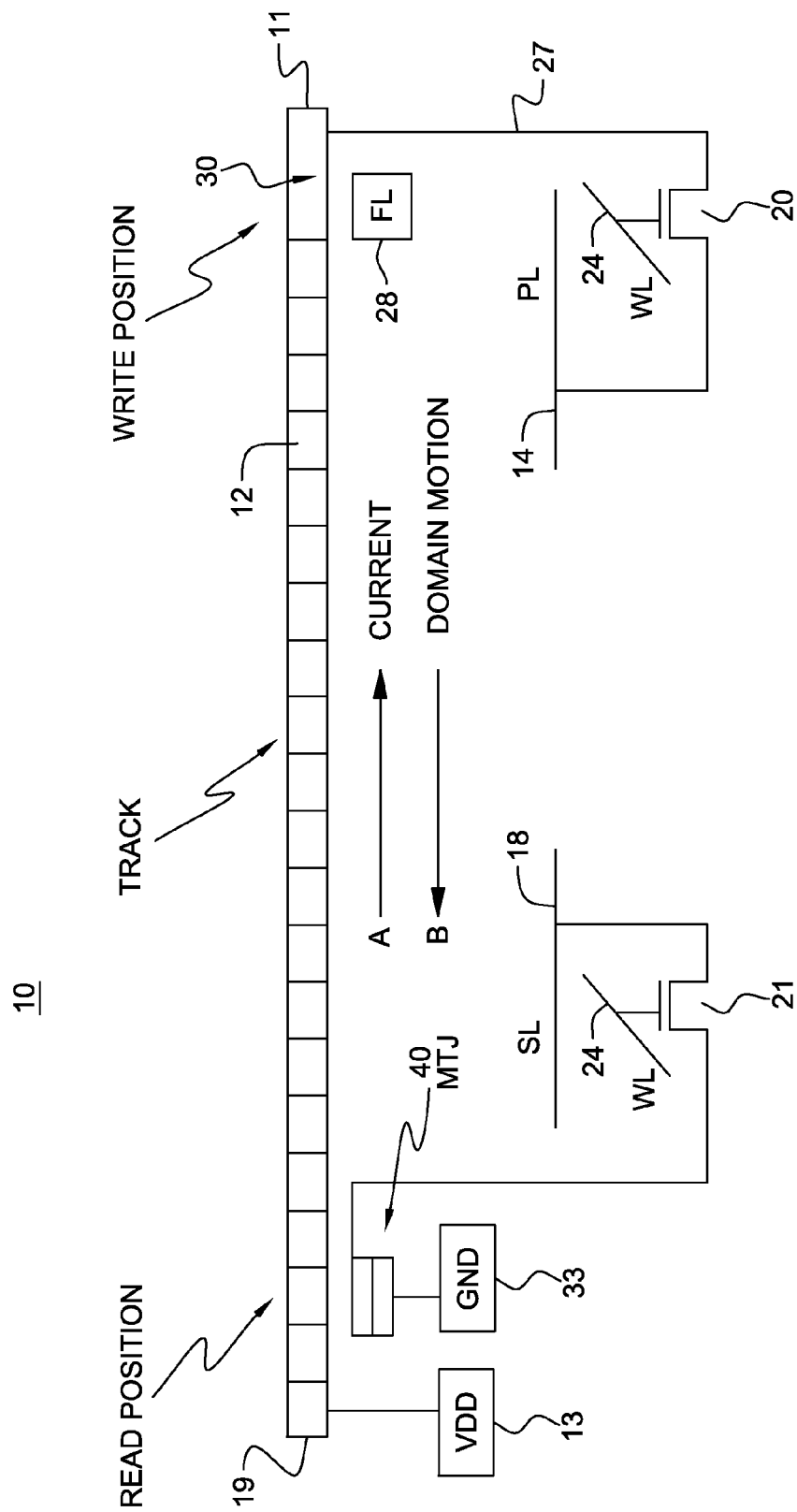
FIG. 1 illustrates a schematic cross-section of an individual magnetic racetrack memory apparatus and its associated unit cell circuitry according to one embodiment.

The invention provides a high density Magnetic Racetrack Memory apparatus and method of operating. The high density Magnetic Racetrack Memory apparatus is formed of a two dimensional array of "unit cells", each unit cell comprising a plurality "M" of individual Magnetic Racetrack Memory "tracks" 10 of ferromagnetic material as shown in FIG. 1. FIG. 1 particularly illustrates an example schematic cross-section of an individual track 10 capable of storing "N" bits 15 along its length, and, as shown, including associated unit cell read and write circuitry. In one embodiment a single Magnetic Racetrack Memory track may comprises up to 1 Kilobit (e.g., about 1000 bits) of storage.

Figure 3:
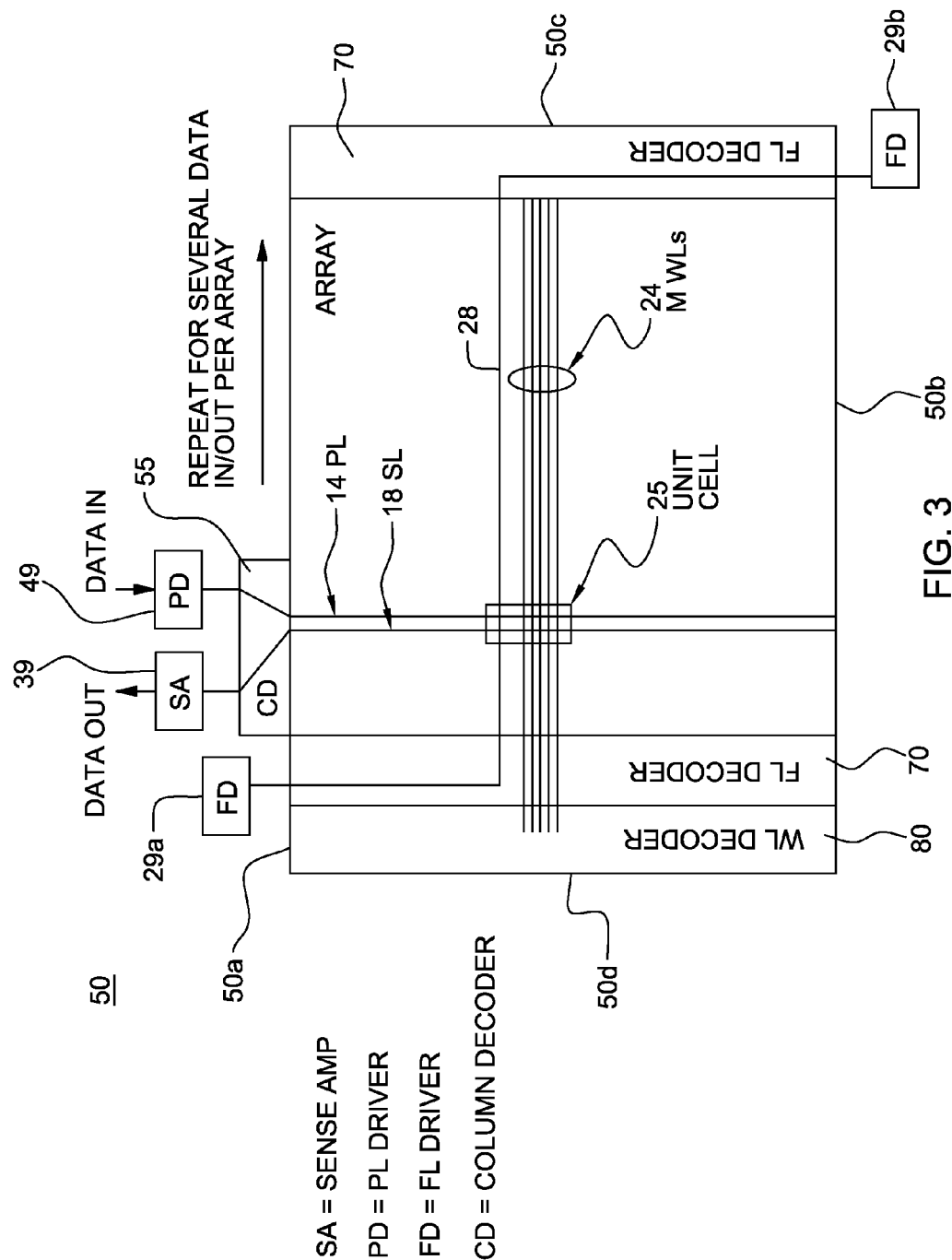
FIG. 3 illustrates a floor plan of a 2-dimensional array of unit cells, each cell including multiple memory tracks each with associated circuitry of FIG. 1.

As shown in FIG. 1, and in more detail in FIG. 3, each unit cell 25 comprising a plurality "M" individual tracks 10 is accessed by one "push line" (PL) 14 and one "sense line" (SL) 18 which run through the array in a particular direction, and M "word lines" (WLs) 24 and one "field line" (FL) 28 which, in one example embodiment, run through the array in an orthogonal direction. It is understood that other orientations are conceivable. Each of the M WLs is used to select one of the M tracks, whereas the PL, SL and FL service all of the M tracks within the unit cell.

Within each unit cell 25, the FL 28 is provided that is formed substantially perpendicular and in close proximity, e.g., approximately 20 nm in a 90 nm technology, to one end of each track. In operation, a FL current pulse is asserted to create a magnetic domain within each track. This location along the length of the track is referred to as the "bit write position" or "bit storage position". Further, as shown in FIG. 1, within each unit cell, each of the M WLs is connected to a gate of a first transistor, e.g., an FET 20, which connects the PL 14 to one end 11 of the corresponding track. The opposite end 19 of the track is connected to a supply voltage VDD 13. This configuration allows a current pulse asserted on PL 14 to advance the magnetic domains along the selected track by one bit position.

Within each unit cell 25, each of the M WLs is connected to a gate of a transistor device, e.g., FET 21, that connects the SL to one terminal of an MTJ device 40 in close proximity, e.g., approximately 20 nm in a 90 nm technology, to the corresponding track 10. The opposite terminal of the MTJ is connected to a supply voltage, e.g., a VDD or ground or GND level. This configuration allows the resistance of the selected MTJ 40 and hence the state of the magnetic domain immediately adjacent on the track 10 to be sensed via the sense line SL 18. This location along the length of the track is referred to as a "read position" and is located at the opposite end of the track from the write position.

In one embodiment, as shown in FIG. 1, each track 10 is operated as a FIFO, writing bits to the write position at one end 11 of the track and, moving them along the track to the opposite track end 19 where they are read by the proximately located MTJ device 40. In one embodiment, data is accessed in blocks of N bits corresponding to the bits stored along one track, so that between block operations the data is stored in a known position along the track. A block operation (write block, read block) includes N bit operations (write bit, read bit).

In one embodiment of the invention, a write bit operation includes the following sequence: (a) A FL current pulse, which, in an example embodiment, may comprise an example pulse of approximately 3 mA of 3 ns duration, is applied to the track to create a domain of a particular polarity (e.g., equivalent to logic "0", or a logic "1") at the write position of each track along the FL's length. (b) If that data state is to be written, a PL current pulse is then applied, advancing the domains of the selected track by one bit position; (c) A FL current pulse, e.g., approximately −3 mA by 3 ns width (of the opposite polarity) creates a domain of the opposite polarity (e.g., equivalent to logic 1) at the write position of each track along the FL's length. (d.) If that data state is to be written, a PL current pulse, e.g., of approximately 1 mA by 3 ns duration, is applied, advancing the domains of the selected track by one bit position. This sequence of steps allows multiple unit cells along the FL (with different desired data states) to be written in parallel. That is, as the FL intersects many tracks along its length, the FL current pulses described above will create 0 and 1 domains at the write position of each of these tracks exactly as for the particular track described above. If PL current pulses are also applied to those tracks, data may be written to those tracks at the same time as to the particular track described above.

In one embodiment of the invention, a read bit operation includes the following sequence. (a) the resistance of the selected MTJ 40 and hence the state of the domain at the read position of the selected track is sensed via the SL 18. (b) Perform a write bit operation as described above, writing the data state which was just read so that the selected track is returned to its original state at the end of the read block operation.

In operation of the magnetic racetrack, exploiting magnetoresitive properties of the track magnetic material, application of a FL current pulse in the proximity of the track, in a particular direction, creates a magnetic domain 30 in the track of a corresponding particular polarity at the write position of the track 10. For example, if a WL pulse is asserted as high, the two FETs 20, 21 are turned on, allowing the PL signal 14 and SL signal 18 to access this particular track. If the applied PL signal 14 is pulsed low, current will flow from VDD through the track and FET 20 to the PL, e.g., in the direction of arrow A shown in FIG. 1. This current causes the domains to move in the opposite direction along the track (from the write position to the read position), e.g., in the direction of arrow B shown in FIG. 1. In one embodiment, this magnetic domain of a particular polarity moves or advances the equivalent of one bit position along the track. The resistance of the MTJ device 40 and hence the state of the magnetic domain at the read position is determined by applying a small voltage (e.g., approximately 0.2V) on the SL input 18 and measuring the current flowing from the SL 18 through the FET 21 and MTJ 40 to GND.

Figure 2:
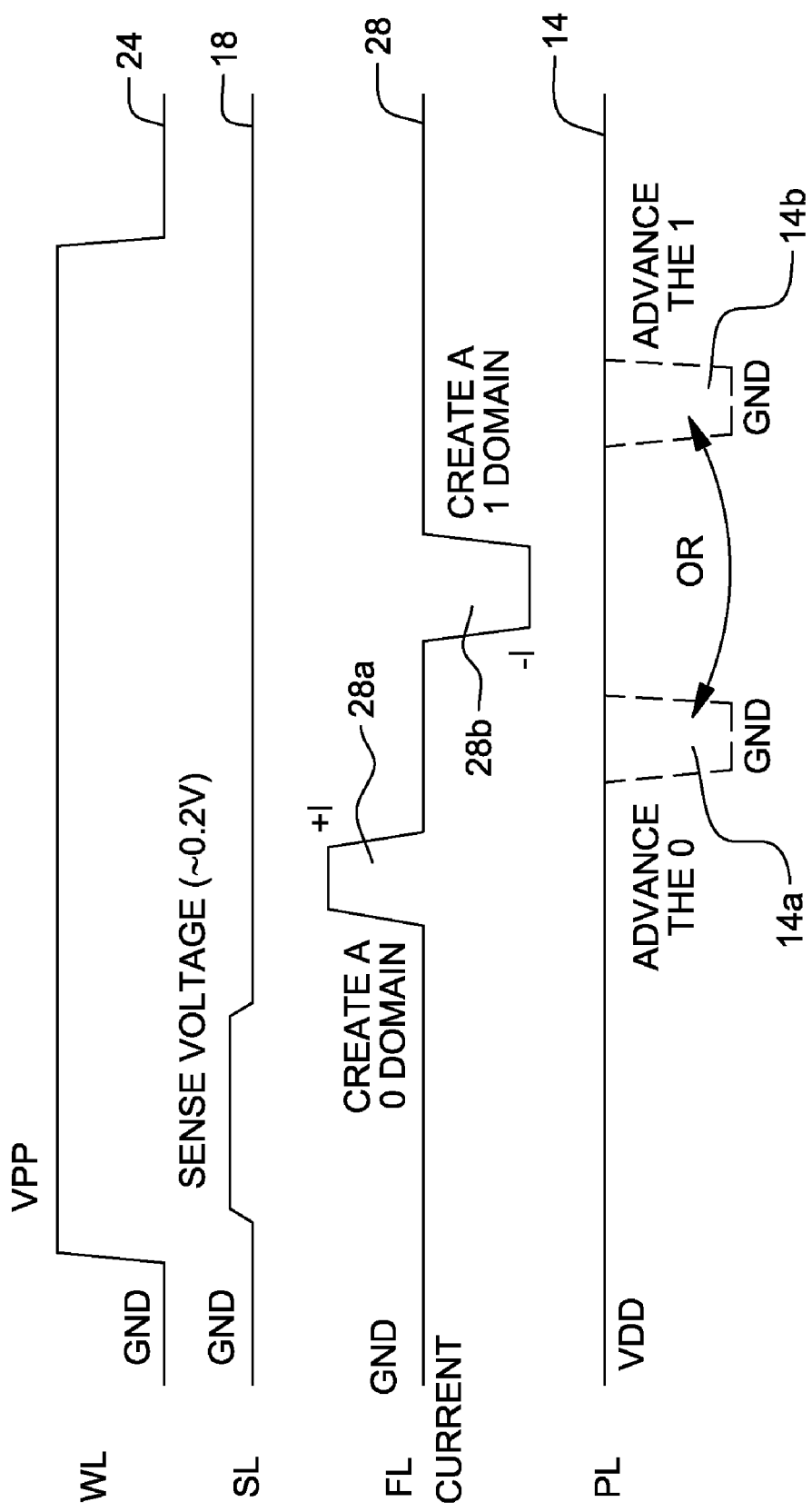
FIG. 2 illustrates an example timing diagram for a read bit operation performed by the apparatus of FIG. 1.

FIG. 2 is an example timing diagram of signals used for performing a read bit operation of an individual magnetic racetrack memory track in accordance with this embodiment. As shown in FIG. 2, the WL 24 pulse is asserted high to elect the corresponding track. During the time that WL pulse 24 is asserted high, a small voltage signal (e.g., approximately 0.2V) is applied to the SL 18 to enable the sensing of the bit at the read position using the MJT device. That is, the assertion of the small voltage signal enables current flow into the SL that is measured to determine the resistance of the MTJ device 40 to determine the state of the domain at the read position of the track.

As further shown in FIG. 2, the following sequence then writes a domain of the same data state (e.g., a corresponding level 0 or level 1 bit) into the track so that the track is returned to its original state at the end of the read block operation. Thus, during the time that WL pulse 24 is asserted high, a corresponding current pulse is applied to the FL line 28 according to the polarity of the bit that was just read. For example, a positive FL signal 28a in the form of a current pulse (e.g., indicated as logic +1) is asserted, that creates a 0 domain at the write position of the track. If a 0 data state is to be written back to the track, then, immediately after assertion of the FL signal 28a, a negative signal 14a, e.g., in the form of a negative pulse (from VDD down to GND), is asserted at the PL line 14 to advance the domain by one bit position along the track. Similarly, during the time that WL pulse 24 is asserted high, a negative FL current pulse 28b (e.g., indicated as logic −1) is applied that creates a 1 domain at the write position of the track. If a 1 data state is to be written back to the track, then, immediately after assertion of the FL signal 28b, a negative signal 14b, e.g., in the form of a negative pulse (from VDD down to GND), is asserted at the PL line 14 to advance the domain by one bit position along the track. At the end of N such read bit operations, all bits along a magnetic racetrack memory track have been read and the track has been returned to its original state.

In a further embodiment, FIG. 3 illustrates an example 2-D array 50 depicting a portion of the semiconductor device layout of a high density magnetic racetrack memory architecture. The array is a two dimensional array 50 of unit cells 25. Along a top edge 50a of the array is formed a column decoder 55 associated with a unit cell that includes the circuitry for connecting a SL signal 18 from a unit cell 25 to a sense amplifier 39 when reading a bit value of the associated magnetic memory domain at the read position. The sense amplifier 39 receiving SL signal 18 generates an output signal, e.g., Data Out signal, corresponding to a bit value of the associated magnetic memory domain advanced to the read position. Further, the decoder 55 includes circuitry for connecting the PL push signal 14 from a PL driver 49 to the unit cell 25. The PL driver is controlled by an input signal, e.g., a Data In signal. In one embodiment, the column decoder 55, sense amplifier 39 and PL driver group 49 may be repeated a plurality of times across the width of the array 50 to allow several Data In/Out per array. This configuration facilitates reading and writing of a plurality of bits in parallel. On each of opposite edges, e.g., edges 50a, 50b, of the array, a FL decoder 70 connects a selected FL field line signal 28 to a FL driver 29a or sink 29b. This double-ended drive/sink approach is required to provide both positive and negative current pulses on the FL thereby creating associated bit values at the magnetic domain formed from application of the FL signal. That is, FL driver 29a connects a selected FL signal 28a to the unit cell during write operation or FL driver 29b connects a selected FL signal 28b to the unit cell during a write operation. Further, on a side 50d of the array 50 is provided a WL decoder 80, which drives the selected WL 24 in a manner so as to select a single track 10 from among of the "M" multiple tracks in the unit cell 25 for reading data from and/or storing (writing) data bits thereto. In operation, in one example embodiment, the WL decoder device receives a select track instruction or code and, as the WL decoder is a standard memory WL decoder, it generally receives an address and an enable signal for selecting a particular WL in response. This WL then selects 1 track per unit cell along the length of the WL. The column decoder in turn chooses a subset of these tracks for connection to the SAs and PDs. In one embodiment, the WL decoder decodes the select track instruction to generate a select signal for activating a single magnetic memory structure. In one embodiment, at most, one WL per array may be selected at any time, however, the invention is not so limited, and can be configured to perform parallel read/write operations at different tracks. However, although multiple unit cells/tracks/bits may be simultaneously accessed along a single selected WL, it is not possible to select more than one WL per array as there would be no method for the SA or PD to distinguish between the two.

Figure 4:
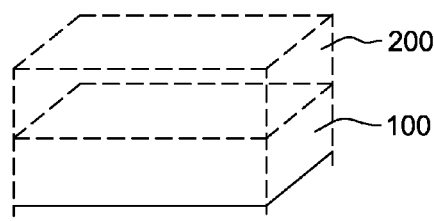
FIG. 4 illustrates a conceptual unit cell floor plan of a device architecture for a high density racetrack memory array; and, FIG. 5 illustrates a circuit schematic diagram of a magnetic racetrack memory cell according to one embodiment of the present invention.
Figure 5:
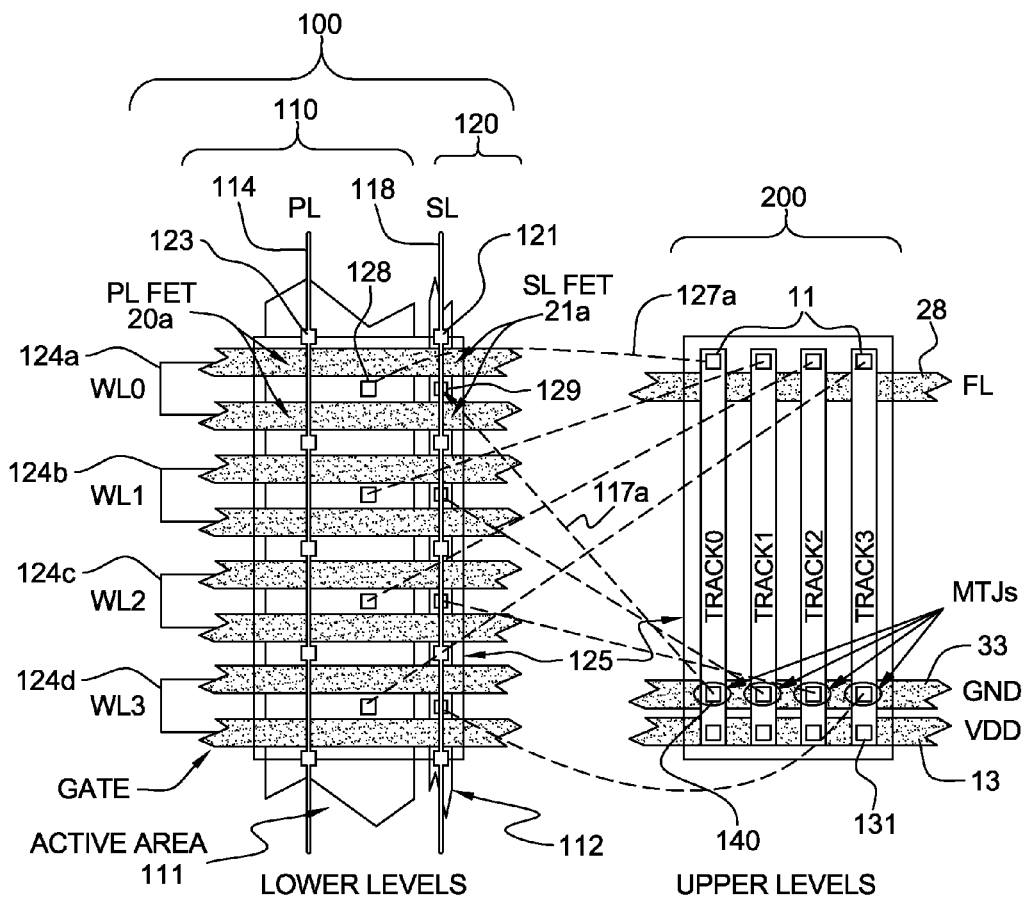

FIGS. 4 and 5 illustrates a physical configuration of the high density magnetic racetrack memory 150 manufactured as part of a semiconductor device. As shown in FIG. 4, in one example implementation, the high density magnetic racetrack memory 150 is a two tiered structure formed of magnetic, conductive and semiconducting structures on a substrate including: a lower layer 100 comprising semiconductor circuits including the SL and PL FET transistors and including the WL, SL and PL signal lines; and, disposed immediately above layer 100 and aligned with and operatively connected thereto, a layer 200 comprising the plurality of unit cells forming the magnetic racetrack memory array such as shown in FIG. 3 including associated ME' devices for each track of the array. It is understood that other physical device architectures of the high density magnetic racetrack memory are contemplated besides the configuration depicted in FIGS. 4 and 5.

FIG. 5 depicts the semiconductor circuitry forming a portion of a high density magnetic racetrack memory array. In the example embodiment of the high density magnetic racetrack memory architecture 150 shown in FIG. 5, there is shown a unit cell including M number of tracks or WLs per unit cell. For purposes of illustration, the number of tracks M of a unit cell equals four (4), however the invention is not so limited. FIG. 5 further depicts conceptually the alignment between the unit cell of magnetic racetrack memory tracks depicted within a unit cell boundary 125 at upper layer 200 of FIG. 4, and the corresponding connections with the lower layer circuitry 100 of FIG. 4. For example, as shown in FIG. 5, there is shown a semiconductor region 110 providing the active device structure 111 for each PL transistor structure 20 associated with each magnetic memory racetrack. For example, formed at lower layer 100, the semiconductor region 110 includes respective gate structures which comprise, in the embodiment depicted, gate structures $124a, \ldots, 124d$, associated with respective WLs indicated as $WL_0, \ldots, WL_3$, and each gate structure $124a, \ldots, 124d$ adapted to receive a respective WL signal for selecting a particular magnetic memory track. Gate structures $124a, \ldots, 124d$ are conductors that may be formed above a corresponding dielectric gate structure (not shown). It is understood that, in a standard CMOS process, an FET is created wherever the gate conductor intersects the active area region, as they do in region 110 forming the PL FETs 20, e.g., PL FET 20 as shown in FIG. 1. Standard lithographic techniques including damascene processes and ion doping or deposition techniques may be used to form the PL FET and WL structures in region 110. In one example embodiment, FIG. 5 illustrates two gate fingers in parallel, per FET device, that is a well-known technique for efficient FET layout. Other configurations are possible. Each of the PL FETs depicted in FIG. 5 being associated with $WL_0, \ldots, WL_3$ includes doped drain and source regions at each side of the WL gate finger. The PL line 114 comprising a conductive structure is electrically connected at one terminal (source or drain) of each PL FET. Thus, each FET 20, such as the example PL FET depicted as FET 20a in FIG. 5, includes a FET terminal 123 (drain or source) that is electrically connected to the PL conductor (e.g., using conductive via and/or wire) 114. Further for the example PL FET 20a depicted, the opposing terminal FET (source or drain) 128 is electrically connected to the write position 11 of the magnetic memory track "Track 0" corresponding to $WL_0$ via a conductive structure (wire and/or via) shown as broken line 127a. Similarly, as shown in FIG. 5, like conductive structures are shown in broken lines connecting a FET terminal (doped drain or source region) at one side of the WL gates $WL_1, \ldots, WL_3$ to a respective write positions 11 of a respective the magnetic memory track "Track 1"-"Track 3" via like conductive structures 127a.

As further shown in FIG. 5, there is provided a semiconductor region 120 providing the active device region 112 for each SL transistor structure 21 associated with each magnetic memory racetrack. For example, formed at lower layer 100, the semiconductor region 120 includes the same respective gate structures, in the embodiment depicted, gate structures 124a, . . . ,124d, associated with respective WLs indicated as $WL_0, \ldots, WL_3$ adapted to receive a respective WL signal for selecting a particular magnetic memory track. In one embodiment depicted, respective gate structures 124a, . . . ,124d extend from the first active region 111 to the second active region 112 and may likewise be formed above a corresponding dielectric gate structure (not shown). In a standard CMOS process, an FET is created wherever the gate conductor intersects the active area region, as they do here in region 120 to form the SL FETs 21, e.g., SL FET 21 as shown in FIG. 1. Standard lithographic techniques including damascene processes and ion doping or deposition techniques may be used to form the SL FET and WL structures in region 120. For example, the SL FETs depicted in FIG. 5 being associated with $WL_0, \ldots, WL_3$ each includes doped drain and source regions at each side of the WL gate. The SL line 118 comprising a conductive structure is electrically connected at one terminal (source or drain) of each SL FET. Thus, each FET 21, such as the example SL FET depicted as FET 21a in FIG. 5, includes a FET terminal 121 (drain or source) that is electrically connected to the SL conductor (e.g., using conductive via and/or wire) 118. Further, each respective FET 21 includes an opposing FET terminal 129 (drain or source) that electrically connects to an associated MTJ sensing device terminal proximate to the write position of a respective magnetic racetrack. For the example SL FET 21a depicted in FIG. 5, the opposing terminal FET (source or drain) 129 is electrically connected to the MTJ sensing device terminal 140 at a read position of the magnetic memory track "Track 0" corresponding to $WL_0$ via a conductive structure (e.g., using conductive wire and/or via) shown as broken line 117a. Likewise, as shown in FIG. 5, like conductive structures are shown in broken lines connecting a respective FET terminal (doped drain or source region) at one side of the WL gates $WL_1, \ldots$ ,$WL_3$ to a respective MTJ sensing device terminal 140 at a read position of a corresponding magnetic memory tracks "Track 1"-"Track 3" via like conductive structures 117a.

As further shown in FIG. 5, there is depicted an FL conductive structure 28 that is formed in the upper layer 200 and extends, in the embodiment shown, in a substantially transverse orientation and proximate to the magnetic racetrack memories "Track 0"-"Track 3" of the unit cell. Likewise, a conductive structure 13 providing a power supply voltage VDD is formed in the upper layer 200 and extends, in the embodiment shown, in a substantially transverse orientation and proximate to the magnetic racetrack memories "Track 0"-"Track 3" of the unit cell near the read position. A respective electrical connection 131 is provided from the conductive structure 13 to each magnetic track, e.g., using conductive via/wires. Likewise, a further conductive structure 33 providing an electrical ground, is formed in the upper layer 200 that extends, in the embodiment shown, in substantially transverse orientation and proximate to the magnetic racetrack memories "Track 0"-"Track 3" of the unit cell near the read position. The conductive structure 33 however connects to a respective MTJ device associated with a respective magnetic racetrack via an electrical connection, e.g., using conductive via/wires.

As mentioned, the unit cell memory tracks "Track 0"-"Track 3", shown in FIG. 5, are provided in a layer 200 above the FET layer 100 with the electrical connections shown. Although not shown, in an alternate embodiment, several levels of high density wiring are configured to make the necessary connections. It is noted that in the embodiment depicted in FIG. 5, active device region 110 for PL FETs 20 associated with the PL are considerably wider (i.e. have a wider active area shape) than those associated with the SL as they conduct higher currents.

Although the FIGS. 1 and 5 depict a magnetic memory racetrack oriented parallel to the substrate, according to an alternate embodiment, the same array architecture and method of operation may be applied to magnetic memory racetracks oriented as a pillar or perpendicular to the substrate.

Although an example of the present invention has been shown and described, it would be appreciated by those skilled in the art that changes might be made in the embodiment without departing from the principles and spirit of the invention, the scope of which is defined in the claims and their equivalents.

What is claimed is:

1. A high density memory system comprising:
   a plurality of M magnetic memory structures, each of said plurality of M magnetic memory structures including a track of multiple magnetic domains corresponding to N bits and including a magnetic material, said track of multiple magnetic domains including a first position and a second position different from said first position;
   M word lines, wherein each of said M word lines is connected to a gate of a first transistor of which a source or drain is connected to one of said M first positions, and is connected to a gate of a second transistor of which a source or drain is connected to a sensing device configured to read memory bit values stored at a magnetic domain at one of said M second positions; and
   a field line configured to apply a pulse signal to simultaneously create a magnetic domain of a first polarity at each said M first positions; and,
   a first decoder device applying word line signals to select a first subset of said plurality of magnetic memory structures; and
   a second decoder applying a respective push signal to advance each magnetic domain created in each respective said first subset of magnetic memory structures toward a corresponding second position,
   said field line subsequently applying a second signal to simultaneously create a magnetic domain of a second polarity at each of said M first positions of said plurality of magnetic memory structures, and
   said first decoder applying word line signals to activate a second subset of said plurality of magnetic memory structures, and said second decoder applying a respective push signal to advance each said multiple magnetic domain created in each respective said magnetic memory structure of said second subset toward a corresponding second position therein.

2. The system as claimed in claim 1, further comprising a wherein said first decoder device connects to each of said M first positions through M connections, each of said M connections including one of said M word lines connected to a gate of one of said first transistors, said first decoder device configured to activate a set of at least one magnetic memory structure from among said plurality when a corresponding set of at least one first transistor is turned on.

3. The system as claimed in claim 2, further comprising:
a bit drive device for applying said pulse signal to said field line.

4. The system as claimed in claim 3, wherein each of said M first transistors has a gate terminal for receiving said word line signal for selecting the corresponding magnetic memory structure, and when selected, the corresponding first transistor couples said push signal to the corresponding magnetic memory structure to advance magnetic memory domains therein along the magnetic memory structure toward said second position therein, and each of said M second transistors has a gate terminal for receiving a sense signal, and, when selected, the corresponding second transistor reads magnetic racetrack memory domain bit value at a second position in the corresponding magnetic memory structure and couples a sense signal from said sensing device to a sense amplifier to provide a bit value output during a bit read operation.

5. The system as claimed in claim 4, wherein said sensing device for reading a memory bit value at a second position comprises a Magnetic Tunnel Junction (MTJ) device for generating said sense signal, said Magnetic Tunnel Junction device located proximate a magnetic racetrack memory structure for sensing a bit value located at a magnetic racetrack memory domain at said second position.

6. The system as claimed in claim 4, wherein said coupling said push signal generates a current flow through said magnetic memory structure for advancing each formed magnetic racetrack domain a distance corresponding to a bit position along a length of said activated memory structure.

7. The system as claimed in claim 4, wherein bits are written to said first position at one end of the magnetic memory structure and, are advanced along the track towards said second position at an opposite track end for reading by said MTJ device in an order they are written.

8. The system as claimed in claim 3, wherein, within each of said set of activated at least one magnetic memory structure, subsequent to reading a memory bit value stored at a magnetic domain at said second position, said bit drive device is configured to apply said pulse signal to form a new magnetic memory domain at said first position associated with a bit value of the stored memory bit that was just read; and,
said second decoder is configured to apply said push signal for advancing said formed new magnetic memory domain toward said second position of said activated memory structure,
whereby said magnetic memory structure is returned to its original state at an end of the bit read operation.

9. The system as claimed in claim 3, wherein said pulse signal is of a polarity corresponding to a memory bit value to be stored at a magnetic racetrack memory domain.

10. The system as claimed in claim 3, wherein each of said M sensing devices comprises a Magnetic Tunnel Junction (MTJ) device located proximate said magnetic racetrack memory structure, said MTJ device responsive to a bit value located at a magnetic racetrack memory domain at said second position for generating a sense signal corresponding to said read bit value.

11. The system as claimed in claim 3, wherein said second decoder is configured to generate a current flow through said first subset of said plurality of magnetic memory structures for advancing each formed magnetic racetrack domain a distance corresponding to a bit position along a length of said activated memory structure.

12. The system as claimed in claim 3, wherein each said plurality of M magnetic memory structures operates according to a First In First Out method wherein bits are written to said first position at one end of the magnetic racetrack and, responsive to a subsequent asserted push signals, are advanced along the track to towards said second position at an opposite track end for reading by said MTJ device in an order they are written.

13. The system as claimed in claim 3,
wherein each of said M first transistors is configured to couple said push signal to a corresponding magnetic memory structure to advance a corresponding set of magnetic memory domain along the corresponding magnetic memory structure to a corresponding second position therein during a bit read or bit write operation.

14. A method of operating a high density memory array including a plurality of magnetic memory structures, said method comprising:
providing a high density memory system comprising:
a plurality of M magnetic memory structures, each of said plurality of M magnetic memory structures including a track of multiple magnetic domains corresponding to N bits and including a magnetic material, said track of multiple magnetic domains including a first position and a second position different from said first position;
M word lines for selecting a track, a respective word line of said M word lines being connected to a gate of a corresponding first transistor of which a source or drain is connected to a first position of the respective track, and said respective word line being connected to a gate of a corresponding second transistor of which a source or drain is connected to a sensing device configured to read memory bit values stored at a magnetic domain at a second position of the respective track;
M push lines, each respective push line associated with a respective track and connecting a source or drain of said corresponding first transistor for advancing a magnetic domain on a respective track from a first position toward said second position; and
a field line conductor located proximate to and traversing each said plurality of M magnetic memory structures at respective first positions of each said M tracks, said field line receiving a pulse signal configured to simultaneously create a magnetic domain of a same polarity at each said M first positions; said method comprising:
simultaneously creating, by receiving a first pulse signal at said field line, a magnetic domain of a first polarity at each of said M first positions of said plurality of magnetic memory structures;
selecting a first subset of said plurality of magnetic memory structures intended to retain a created domain of said first polarity;
applying a push signal to a respective push line associated with each first subset of said plurality of magnetic memory structures for advancing each a said magnetic domain of said first polarity created in said first subset of magnetic memory structures from among said plurality of M magnetic memory structures toward said second position;
subsequently simultaneously creating, by receiving a second pulse signal at said field line, a magnetic domain of a second polarity at each of said M first positions of said plurality of magnetic memory structures;
selecting a second subset of said plurality of magnetic memory structures intended to retain a created domain of said second polarity; and
applying a push signal to a respective push line associated with each second subset of said plurality of magnetic memory structures for advancing each said magnetic domain of said second polarity created in said second subset of magnetic memory structures toward said second position.

15. The method according to claim 14, further comprising:
performing a bit read operation at said activated magnetic memory structure comprising:
a) implementing a sensing device to read a memory bit value stored at a magnetic domain at said second position of said activated memory structure;
b) subsequent to reading said memory bit value, applying said first pulse signal to form a new magnetic memory domain at said first position associated with a bit value of the stored memory bit that was recently read; and,
c) applying said push signal for advancing said formed new magnetic memory domain toward said second position of said activated memory structure,
whereby said magnetic memory structure is returned to its original state at an end of the bit read operation.

16. The method according to claim 15, further comprising: repeating bit read operation steps a), b) and c) for reading multiple data bits stored in a memory track.

17. The method according to claim 16, wherein said bits are stored by bit storage operations and read out by bit read operations according to a first-in first-out order.

18. The method according to claim 14, wherein said applying said push signal initiates a current flow through said particular magnetic memory structure for advancing each formed magnetic racetrack domain a distance corresponding to a magnetic memory domain toward said second position.

19. The method according to claim 14, wherein said first pulse signal applied to form said magnetic racetrack memory domain is of a first polarity to form a new magnetic memory domain corresponding to a logic "0" bit value level, and said second pulse signal is of a opposite polarity to form a new magnetic memory domain corresponding to a logic "1" bit value level at said first position.

20. The method according to claim 14, wherein said selecting a magnetic memory structure comprises:
receiving a select track instruction at a decoder device; and,
decoding a select track instruction to generate a word line signal for activating said single magnetic memory structure.

* * * * *